(12) United States Patent
Miura

(10) Patent No.: US 7,932,115 B2
(45) Date of Patent: Apr. 26, 2011

(54) METHOD OF PRODUCING PHOTODIODE AND THE PHOTODIODE

(75) Inventor: Noriyuki Miura, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 244 days.

(21) Appl. No.: 12/292,165

(22) Filed: Nov. 13, 2008

(65) Prior Publication Data
US 2009/0140368 A1 Jun. 4, 2009

(30) Foreign Application Priority Data

Nov. 30, 2007 (JP) ................................. 2007-311080

(51) Int. Cl.
*H01L 31/0352* (2006.01)
(52) U.S. Cl. ...................... 438/48; 438/73; 257/E31.038
(58) Field of Classification Search .................... 438/48, 438/73; 257/E31.038
See application file for complete search history.

(56) References Cited

U.S. PATENT DOCUMENTS

| | | | | |
|---|---|---|---|---|
| 7,709,920 | B2 * | 5/2010 | Miura | 257/440 |
| 2008/0296642 | A1 * | 12/2008 | Miura | 257/292 |
| 2009/0140368 | A1 * | 6/2009 | Miura | 257/463 |
| 2009/0184254 | A1 * | 7/2009 | Miura | 250/372 |
| 2009/0184388 | A1 * | 7/2009 | Izumi | 257/463 |

FOREIGN PATENT DOCUMENTS

JP 07-162024 2/1995

* cited by examiner

*Primary Examiner* — George Fourson
(74) *Attorney, Agent, or Firm* — Kubotera & Associates LLC

(57) ABSTRACT

A photodiode includes a photosensitive element formed in a silicon semiconductor layer on an insulation layer. The photosensitive element includes a low concentration diffusion layer, a P-type high concentration diffusion layer, and an N-type high concentration diffusion layer. A method of producing the photodiode includes the steps of: forming an insulation material layer on the silicon semiconductor layer after the P-type impurity and the N-type impurity are implanted into the low concentration diffusion layer, the P-type high concentration diffusion layer, and the N-type high concentration diffusion layer; forming an opening portion in the insulation material layer in an area for forming the low concentration diffusion layer; and etching the silicon semiconductor layer in the area for forming the low concentration diffusion layer so that a thickness of the silicon semiconductor layer is reduced to a specific level.

4 Claims, 8 Drawing Sheets

METHOD OF PRODUCING PHOTODIODE AND THE PHOTODIODE

BACKGROUND OF THE INVENTION AND RELATED ART STATEMENT

The present invention relates to a method of producing a photodiode and the photodiode produced with the method. More specifically, the present invention relates to a photodiode for generating an electrical current upon receiving light such as ultraviolet light, and a method of producing the photodiode.

Recently, an irradiation amount of ultraviolet light has increased due to destruction of the ozone layer, and ultraviolet light in sunlight has become a major concern on a human body and environment. In general, ultraviolet light is invisible light in an ultraviolet light region less than 400 nm, and is categorized into three types of light, i.e., long wave ultraviolet light (UV-A light, a wavelength between 320 nm and 400 nm); intermediate wave ultraviolet light (UV-B light, a wavelength between 280 nm and 320 nm); and short wave ultraviolet light (UV-C light, a wavelength of less than 280 nm).

The three types of light have different effects on a human body or environment depending on wavelengths thereof. More specifically, the UV-A light turns human skin to dark color, and reaches dermis to become a cause of aging. The UV-B light induces skin inflammation and skin cancer. The UV-C light has a strong germicidal action and tends to be absorbed by the ozone layer.

Since sunlight contains visible light and infrared light in addition to ultraviolet light, when a photodiode is used for detecting ultraviolet light, the photodiode needs to separate and detect only ultraviolet light in sunlight.

Patent Reference 1 has disclosed a conventional photodiode for detecting ultraviolet light. The conventional photodiode includes a semiconductor wafer having an SOI (Silicon on Insulator) structure, in which a silicon semiconductor layer with a thickness of about 150 nm is formed on a supporting substrate formed of silicon, and sandwiches an embedded oxide layer. An N-type impurity is diffused into the silicon semiconductor layer at a low concentration.

In the conventional photodiode, an N-type impurity is diffused into the silicon semiconductor layer at a high concentration to form an N+ diffusion layer having a comb shape. Further, a P-type impurity is diffused into the silicon semiconductor layer at a high concentration to form a P+ diffusion layer having another comb shape. The N+ diffusion layer and the P+ diffusion layer are arranged laterally such that the N+ diffusion layer and the P+ diffusion layer are nested with the silicon semiconductor layer in between. A metal wiring portion is electrically connected to the N+ diffusion layer and the P+ diffusion layer, so that a voltage is applied to the metal wiring portion for detecting ultraviolet light.

Patent Reference 1: Japanese Patent Publication No. 07-162024

In the conventional photodiode disclosed in Patent Reference 1, the silicon semiconductor layer with a thickness of about 150 nm is formed on the embedded oxide layer of the semiconductor wafer having the SOI structure. Accordingly, visible light passes through the photodiode, so that the photodiode detects only ultraviolet light. In the conventional photodiode, it is difficult to prevent an influence of reflection at an interface between the silicon semiconductor layer and the embedded oxide layer for the reasons described below, thereby making it difficult to accurately detect ultraviolet light in the ultraviolet light region less than 400 nm.

When visible light passes through the photodiode so that the photodiode absorbs only a wavelength range of ultraviolet, that is, selectively detects only ultraviolet light, a thickness of the photodiode can be determined as follows. First, an optical absorptance $I/I_0$ of silicon can be expressed as an equation (1) according to Beer's law.

$$I/I_0 = \exp(-\alpha Z) \quad (1)$$

where $\alpha$ light absorption coefficient, $Z$ is a light penetration depth, $I$ is a light intensity at a depth $Z$, and $I_0$ is a incident light intensity.

The light absorption coefficient $\alpha$ has wavelength dependence. According to the equation (1), a calculation is conducted for determining a wavelength at which the optical absorptance $I/I_0$ becomes 10%. In the calculation, the optical absorptance $I/I_0$ is determined at various thicknesses of a silicon semiconductor layer, and the wavelength at which the optical absorptance $I/I_0$ becomes 10% is determined according to the thickness of the silicon semiconductor layer.

FIG. 8 is a graph showing a relationship between the thickness of the silicon semiconductor layer and the wavelength at which the optical absorptance $I/I_0$ becomes 10%. As shown in FIG. 8, when the silicon semiconductor layer has a thickness of less than 50 nm, it is possible to selectively detect ultraviolet light in the ultraviolet light region less than 400 nm.

According to the calculation, an experiment was conducted for determining a sensitivity of a photodiode relative to light having various wavelengths. In the experiment, a semiconductor layer with a different thickness in a range less than 50 nm was formed on a semiconductor wafer having the SOI structure. Then, the photodiode of a lateral type was formed in the silicon semiconductor layer.

FIG. 9 is a graph showing the sensitivity of the photodiode and the wavelength of light. The silicon semiconductor layer of the photodiode had a thickness of 40.04 nm.

As shown in FIG. 9, when the photodiode includes the silicon semiconductor layer having a thickness of about 40 nm, a sub-peak exists at a wavelength region of visible light (violet light) longer than the ultraviolet light region less than 400 nm. Accordingly, the photodiode detects the wavelength region of visible light to generate a photo-electric current, and the photo-electric current is contained in a detected photo-electric current.

In the calculation described above, it is assumed that light passes through the silicon semiconductor layer. In an actual case, light is reflected at the interface between the silicon semiconductor layer and the embedded oxide layer. Accordingly, light passes through a shorter path and reacts with visible light having a wavelength shorter than the ultraviolet light region. As a result, the silicon semiconductor layer absorbs visible light, thereby causing the sub-peak.

When the silicon semiconductor layer has a smaller thickness, the sub-peak still appears. An experiment was conducted for determining a wavelength at which the sub-peak was observed in the silicon semiconductor layer having various thicknesses. FIG. 10 is a graph showing a relationship between a wavelength at which the sub-peak was observed and a thickness of the silicon semiconductor layer.

As shown in FIG. 10, when a thickness of the silicon semiconductor layer decreases, a wavelength at which the sub-peak was observed decreases. The relationship between the wavelength Ls (nm) at which the sub-peak was observed and the thickness Tsi (nm) of the silicon semiconductor layer cam be expressed as the following approximate equation (2).

$$Ls = 2.457 \times Tsi + 312.5$$

From FIG. 10 and the equation (2), it is found that it is necessary to make the thickness of the silicon semiconductor layer less than 36 nm for preventing the adverse effect of light reflected at the interface between the silicon semiconductor layer and the embedded oxide layer, and for preventing the photodiode from reacting with visible light having a wavelength longer than 400 nm. That is, when the thickness of the silicon semiconductor layer is less than 36 nm, it is possible to prevent an error upon overlapping the photo-electric current in the visible light region with that in the ultraviolet light region due to the sub-peak in visible light region.

Based on the experiment described above, Patent Reference 2 has disclosed another conventional photodiode for detecting ultraviolet light. The conventional photodiode includes a first silicon semiconductor layer formed on an embedded oxide layer of a semiconductor wafer having the SOI structure. A first photosensitive element is formed in the first silicon semiconductor layer, in which a first P+ diffusion layer and a first N+ diffusion layer are arranged to face each other with a first P− diffusion layer in between.

Further, the conventional photodiode includes a second silicon semiconductor layer having a thickness smaller than that of the first silicon semiconductor layer. A second photosensitive element is formed in the second silicon semiconductor layer, in which a second P+ diffusion layer and a second N+ diffusion layer are arranged to face each other with a second P− diffusion layer in between. The first semiconductor layer has a thickness between 30 nm and 36 nm such as 35 nm, and the second semiconductor layer has a thickness between 3 nm and 30 nm such as 10 nm.

Patent Referent 2: Japanese Patent Application No. 2007-44465

In the conventional photodiode disclosed in Patent Reference 2, it is possible to accurately detect an intensity of ultraviolet light while preventing an influence of light reflected at an interface between the silicon semiconductor layer and an insulation layer. Further, it is possible to separate ultraviolet light in the three wavelength regions and detect intensities thereof through a calculation of two outputs of the first photosensitive element and the second photosensitive element.

In the conventional photodiode disclosed in Patent Reference 2, when the second silicon semiconductor layer is formed, after an element separation layer is formed with an LOCOS (Local Oxidation of Silicon) method, a sacrifice oxidation film is formed in a forming area of the second P− diffusion layer with a thermal oxidation method. Then, the sacrifice oxidation film is removed, thereby forming the second silicon semiconductor layer having a thickness smaller than that of the first silicon semiconductor layer.

After the second silicon semiconductor layer is formed, impurity ions are implanted into the first P− diffusion layer, the first P+ diffusion layer, the first N+ diffusion layer, the second P− diffusion layer, the second P+ diffusion layer, and the second N+ diffusion layer, respectively. Then, the impurity ions are diffused through a thermal processing, thereby forming the first photosensitive element and the second photosensitive element.

In the conventional photodiode disclosed in Patent Reference 2, the forming area of the second P− diffusion layer is processed to be in a thin film, thereby forming the second silicon semiconductor layer. Afterward, the impurity ions are implanted into each diffusion layer. Accordingly, when the impurity ions are implanted into the first silicon semiconductor layer with a large thickness at a high concentration to form the second P+ diffusion layer and the second N+ diffusion layer of the second photosensitive element, a rough surface tends to form in an upper surface of a portion of the second P− diffusion layer with a small thickness adjacent to the second P+ diffusion layer and the second N+ diffusion layer, thereby increasing a dark current.

In view of the problems described above, an object of the present invention is to provide a photodiode and a method of producing the photodiode capable of solving the problems of the conventional photodiode. In the present invention, the photodiode includes a photosensitive element having a low concentration diffusion layer with a thickness smaller than that of a P-type high concentration diffusion layer and an N-type high concentration diffusion layer. In the present invention, it is possible to reduce a dark current of the photodiode.

Further objects and advantages of the invention will be apparent from the following description of the invention.

SUMMARY OF THE INVENTION

In order to attain the objects described above, according to an aspect of the present invention, a photodiode includes a photosensitive element formed in a silicon semiconductor layer on an insulation layer. The photosensitive element includes a low concentration diffusion layer, a P-type high concentration diffusion layer, and an N-type high concentration diffusion layer. In the low concentration diffusion layer, one of a P-type impurity and an N-type impurity is diffused at a low concentration. In the P-type high concentration diffusion layer, the P-type impurity is diffused at a first high concentration. In the N-type high concentration diffusion layer, the N-type impurity is diffused at a second high concentration. In the photosensitive element, the P-type high concentration diffusion layer is arranged to face the N-type high concentration diffusion layer with the low concentration diffusion layer in between.

According to the aspect of the present invention, a method of producing the photodiode includes the step of: forming an insulation material layer formed of an insulation material with transparency on the silicon semiconductor layer after the one of the P-type impurity and the N-type impurity is implanted into the low concentration diffusion layer at the low concentration, the P-type impurity is implanted into the P-type high concentration diffusion layer at the first high concentration, and the N-type impurity is implanted into the N-type high concentration diffusion layer at the second high concentration.

According to the aspect of the present invention, the method of producing the photodiode further includes the steps of: forming an opening portion in the insulation material layer in an area for forming the low concentration diffusion layer through etching for selectively removing the insulation material; and etching the silicon semiconductor layer in the area for forming the low concentration diffusion layer through etching for selectively removing silicon with the insulation material layer having the opening portion as a mask so that a thickness of the silicon semiconductor layer in the area for forming the low concentration diffusion layer is reduced to a specific level.

In the present invention, when the P-type impurity ions and the N-type impurity ions are implanted into the P-type high concentration diffusion layer and the N-type high concentration diffusion layer at the first and second high concentrations, it is possible to prevent a rough surface from generating in an upper surface of the low concentration diffusion layer in an area adjacent to the P-type high concentration diffusion layer and the N-type high concentration diffusion layer. Accordingly, it is possible to reduce a dark current of the photodiode having the photosensitive element with the low concentration diffusion layer having a thickness smaller than that of each of the P-type high concentration diffusion layer and the N-type high concentration diffusion layer. As a result, it is possible to accurately detect an intensity of ultraviolet light.

DETAILED DESCRIPTION OF PREFERRED EMBODIMENTS

Hereunder, preferred embodiments of the present invention will be explained with reference to the accompanying drawings.

Figure 1:
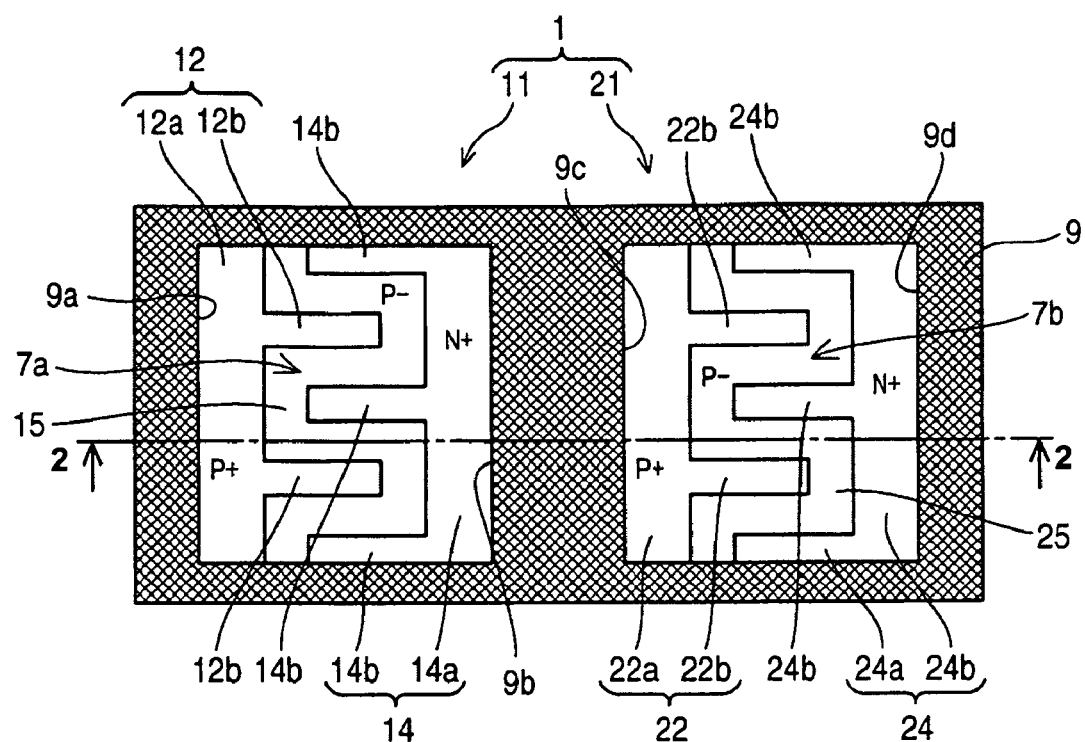
FIG. 1 is a schematic plan view showing a photodiode according to an embodiment of the present invention.
Figure 2:
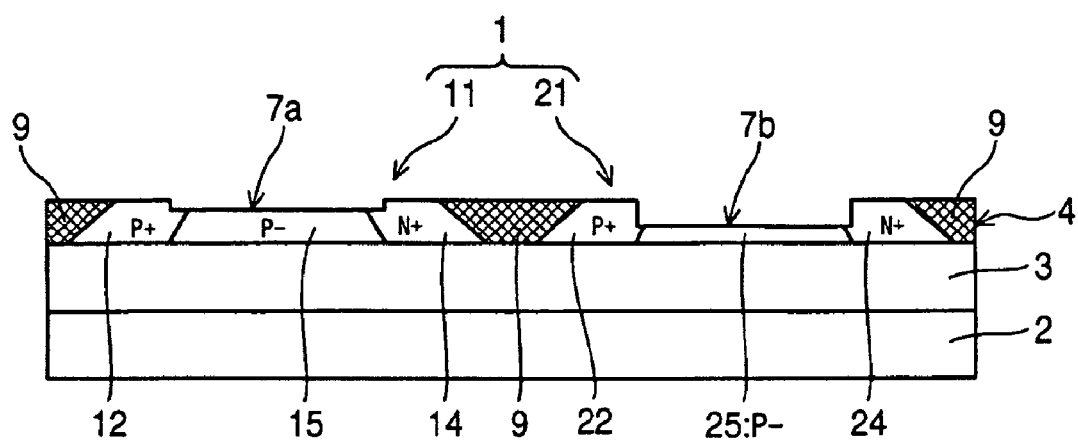
FIG. 2 is a schematic sectional view showing the photodiode taken along a line 2-2 in FIG. 1 according to the embodiment of the present invention.

FIG. 1 is a schematic plan view showing a photodiode 1 according to an embodiment of the present invention. FIG. 2 is a schematic sectional view showing the photodiode 1 taken along a line 2-2 in FIG. 1 according to the embodiment of the present invention.

As shown in FIGS. 1 and 2, the photodiode 1 includes a supporting substrate 2 formed of silicon (Si) and an embedded oxide layer 3 as an insulation layer formed of silicon oxide ($SiO_2$). Further, the photodiode 1 includes a silicon semiconductor layer 4 formed of a thin single crystal silicon, so that the photodiode 1 constitutes a semiconductor wafer having an SOI (Silicon on Insulator) structure. Further, the photodiode 1 includes a first photosensitive element 11 and a second photosensitive element 21 both formed in the silicon semiconductor layer 4.

FIGS. 3(A) to 3(E) are schematic sectional views No. 1 showing a method of producing a photo IC (Integrated Circuit) having the photodiode 1 according to the embodiment of the present invention. FIGS. 4(A) to 4(E) are schematic sectional views No. 2 showing the method of producing the photo IC having the photodiode 1 according to the embodiment of the present invention. FIGS. 5(A) to 5(E) are schematic sectional views No. 3 showing the method of producing the photo IC having the photodiode 1 according to the embodiment of the present invention. FIGS. 6(A) and 6(B) are schematic sectional views No. 4 showing the method of producing the photo IC having the photodiode 1 according to the embodiment of the present invention.

As shown in FIGS. 3(A) to 3(E) to FIGS. 6(A) and 6(B), a first diode forming area 6a and a second diode forming area 6b are defined in the silicon semiconductor layer 4 for forming the first photosensitive element 11 and the second photosensitive element 21 of the photodiode 1, respectively. A transistor forming area 8 is also defined in the silicon semiconductor layer 4 for forming an nMOS element 31 or a pMOS element (not shown) as an MOSFET (Metal Oxide Semiconductor Field Effect Transistor). A first thin film forming area 7a and a second thin film forming area 7b are defined in the first diode forming area 6a and the second diode forming area 6b, respectively, so that the silicon semiconductor layer 4 in the first thin film forming area 7a and the second thin film forming area 7b have thicknesses smaller than that of the silicon semiconductor layer 4 in other area.

In the embodiment, an element separation area 10 is defined in the silicon semiconductor layer 4 for forming an element separation layer 9. The element separation area 10 has a rectangular shape surrounding the first diode forming area 6a, the second diode forming area 6b, and the transistor forming area 8.

In the embodiment, the element separation layer 9 is formed in the silicon semiconductor layer 4 in the element separation area 10 using an insulation material such as silicon oxide, and reaches the embedded oxide layer 3. The element separation layer 9 has a function of electrically isolating the first diode forming area 6a, the second diode forming area 6b, and the transistor forming area 8. As shown in FIGS. 1 and 2, the element separation layer 9 is represented as a hatched area.

In the embodiment, the first photosensitive element 11 is formed in the first diode forming area 6a defined in the silicon semiconductor layer 4. As shown in FIGS. 1 and 2, the first photosensitive element 11 includes a first P+ diffusion layer 12 as a P-type high concentration diffusion layer. A P-type impurity such as boron (B) and the likes is diffused in the silicon semiconductor layer 4 in the first diode forming area 6a at a relatively high concentration to form the first P+ diffusion layer 12. The first P+ diffusion layer 12 has a comb shape formed of a base portion 12a contacting with an inner side 9a of the element separation layer 9 and a plurality of teeth portions 12b extending from the base portion 12a toward an opposite inner side 9b of the element separation layer 9 opposite to the inner side 9a. More specifically, the first N+ diffusion layer 12 is formed in a n character shape, in which two teeth portions 12b extend from the base portion 12a.

In the embodiment, the first photosensitive element 11 further includes a first N+ diffusion layer 14 as an N-type high concentration diffusion layer. An N-type impurity such as phosphorous (P) and arsenic (As), i.e., an opposite type to that of the P-type high concentration diffusion layer 12, is diffused in the silicon semiconductor layer 4 in the first diode forming area 6a at a relatively high concentration to form the first N+ diffusion layer 14. The first N+ diffusion layer 14 has a comb shape formed of a base portion 14a contacting with the opposite inner side 9b of the element separation layer 9 and a plurality of teeth portions 14b extending from the base portion 14a toward the inner side 9a of the element separation layer 9. More specifically, the first N+ diffusion layer 14 is formed in an E character shape, in which three teeth portions 14b extend from the base portion 14a at both end portions and a center portion thereof.

In the embodiment, the first photosensitive element 11 further includes a first P– diffusion layer 15 as a low concentration diffusion layer. A P-type impurity is diffused at a relatively low concentration in a portion of the silicon semiconductor layer 4 with a relatively small thickness contacting with the first P+ diffusion layer 12 and the first N+ diffusion layer 14 with the teeth portions 12b and 14b thereof nested with each other to form the first P– diffusion layer 15. A depleted layer is formed in the first P– diffusion layer 15, so that ultraviolet light absorbed in the depleted layer generates electron-hole pairs in the first P– diffusion layer 15.

As shown in FIG. 1, the first thin film forming area 7a is defined in the first P– diffusion layer 15 between the first P+ diffusion layer 12 with the n character shape and the first N+ diffusion layer 14 with the E character shape in the first diode forming area 6a. The first thin film forming area 7a is further defined in portions of the first P+ diffusion layer 12 and the first N+ diffusion layer 14 adjacent to the first P– diffusion layer 15. Accordingly, it is possible to form the portion of the silicon semiconductor layer 4 with a relatively small thickness in the first thin film forming area 7a.

In the embodiment, similar to the first photosensitive element 11, the second photosensitive element 21 is formed in the second diode forming area 6b defined in the silicon semiconductor layer 4. As shown in FIGS. 1 and 2, the second photosensitive element 21 includes a second P+ diffusion layer 22 as a P-type high concentration diffusion layer. The second P+ diffusion layer 22 has a n character shape formed of a base portion 22a contacting with an inner side 9c of the element separation layer 9 and a plurality of teeth portions 22b extending from the base portion 22a toward an opposite inner side 9d of the element separation layer 9 opposite to the inner side 9c.

In the embodiment, the second photosensitive element 21 further includes a second N+ diffusion layer 24 as an N-type high concentration diffusion layer. The second N+ diffusion layer 24 has an E character shape formed of a base portion 24a contacting with the opposite inner side 9d of the element separation layer 9 and a plurality of teeth portions 24b extending from the base portion 24a toward the inner side 9c of the element separation layer 9 opposite to the opposite inner side 9d.

In the embodiment, the second P+ diffusion layer 22 and the second N+ diffusion layer 24 are arranged such that the teeth portions 22b and the teeth portions 24b are nested with each other while a second P– diffusion layer 25 as a low concentration diffusion layer is disposed between the second P+ diffusion layer 22 and the second N+ diffusion layer 24. The second P– diffusion layer 25 is formed in a portion of the silicon semiconductor layer 4 having a thickness smaller than that in the first thin film forming area 7a.

As shown in FIG. 1, the second thin film forming area 7b is defined in the second P– diffusion layer 25 between the second P+ diffusion layer 22 with the n character shape and the second N+ diffusion layer 24 with the E character shape in the second diode forming area 6b. The second thin film forming area 7b is further defined in portions of the second P+ diffusion layer 22 and the second N+ diffusion layer 24 adjacent to the second P– diffusion layer 25. Accordingly, it is possible to form the portion of the silicon semiconductor layer 4 with a small thickness in the second thin film forming area 7b.

Figure 4A:
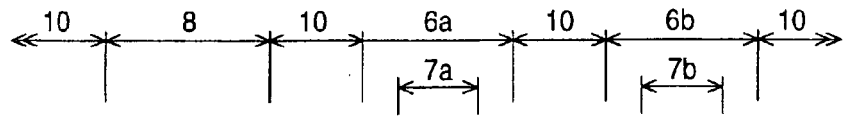
FIGS. 4(A) to 4(E) are schematic sectional views No. 2 showing the method of producing the photo IC having the photodiode according to the embodiment of the present invention.
Figure 4A:
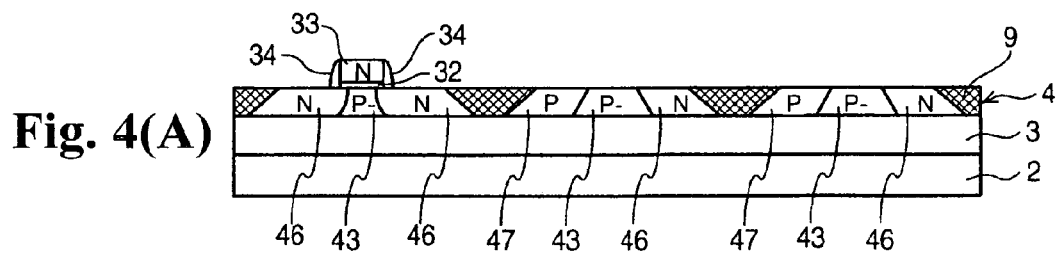
Figure 4B:
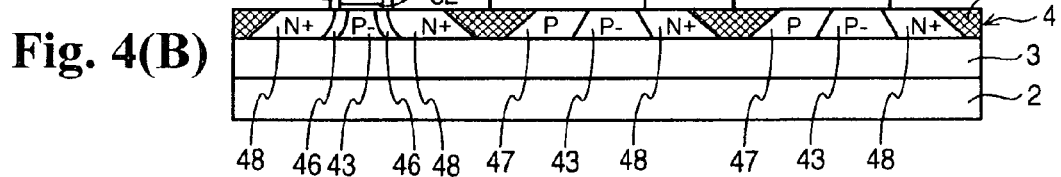
Figure 4C:
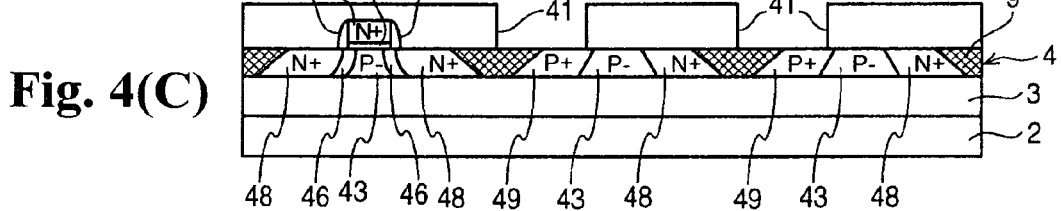
Figure 4D:
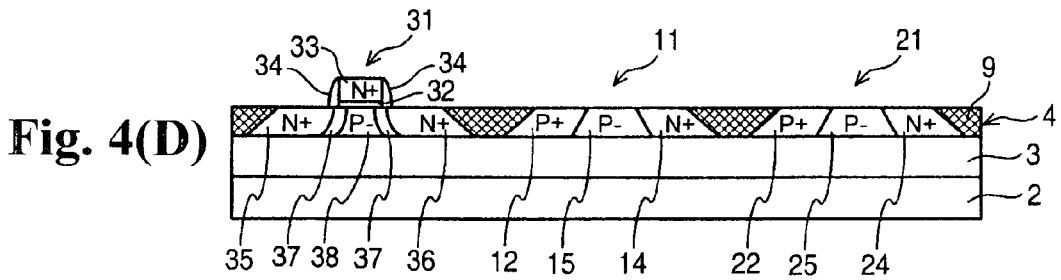

In the embodiment, when the first photosensitive element 11 and the second photosensitive element 21 are formed, the nMOS element 31 and a pMOS element (not shown) are formed in the silicon semiconductor layer 4 as shown in FIG. 4(D). More specifically, the nMOS element 31 is formed in the transistor forming area 8 defined in the silicon semiconductor layer 4.

As shown in FIG. 4(D), the nMOS element 31 includes a gate oxide film 32. The gate oxide film 32 is formed of an insulation film having a relatively small thickness and formed of an insulation material such as silicon oxide and the likes. Further, the nMOS element 31 includes a gate electrode 33. The gate electrode 33 is an electrode formed of a material such as poly-silicon with an impurity of a type the same as that of an impurity of a source layer 35 (described later) diffused therein at a relatively high concentration.

In the embodiment, the gate electrode 33 is disposed at a center portion of the transistor forming area 8 in a gate length direction to face the silicon semiconductor layer 4 in the transistor forming area 8 with the gate oxide film 32 in between. Sidewalls 34 formed of an insulation material such as silicon nitride ($Si_3N_4$) and the likes are formed on side surfaces of the gate electrode 33.

In the embodiment, the source layer 35 and a drain layer 36 with an N-type impurity diffused therein at a relatively high concentration are formed in the silicon semiconductor layer 4 at both sides of the gate electrode 33 in the transistor forming area 8, respectively. Each of the source layer 35 and the drain layer 36 includes an extension portion 37 on a side of the gate electrode 33. An impurity having a type the same as that of the source layer 35 is diffused in the extension portion 37 at a concentration (intermediate concentration) lower than that of the source layer 35.

In the embodiment, a P-type impurity, a type opposite to that of the source layer 35 below the gate electrode 33, is diffused into the silicon semiconductor layer 4 between the extension portions 37 of the source layer 35 and the drain layer 36 at a relatively low concentration to function as a channel area 38 for forming a channel of the nMOS element 31. Note that when an impurity having a type opposite to that of the nMOS element 31 is diffused, the pMOS element is formed in the transistor forming area 8 defined in the silicon semiconductor layer 4.

In the embodiment, the gate length direction extends in parallel to an upper surface of the silicon semiconductor layer 4 from the source layer 35 to the drain layer 36, or vice versa.

As shown in FIG. 3(A) to 6(E), a positive type resist or a negative type resist is coated on the silicon semiconductor layer 4, and the resist is processed through exposure and development in photolithography to form a resist mask 41 as a mask member. The resist mask 41 functions as a mask during etching or ion implantation.

Figure 10:
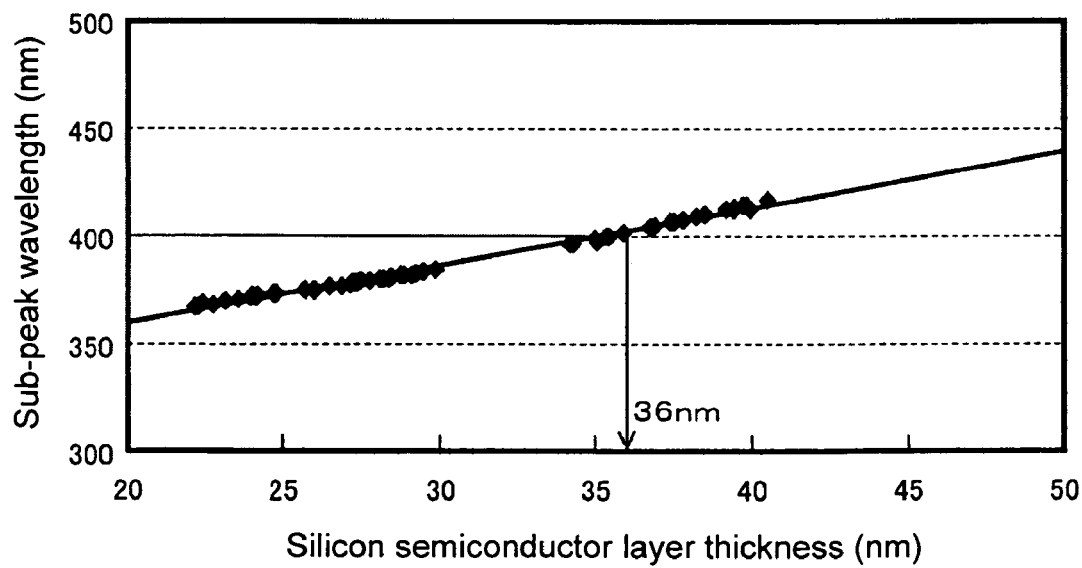
FIG. 10 is a graph showing a relationship between a wavelength at which a sub-peak is observed and a thickness of a silicon semiconductor layer.

According to the relationship between the wavelength at which the sub-peak is observed and the thickness of the silicon semiconductor layer shown in FIG. 10, the portions of the silicon semiconductor layer 4 in the first thin film forming area 7a and the second thin film forming area 7b have thicknesses in a range between 3 nm and 36 nm. When the thickness of the silicon semiconductor layer 4 becomes greater than 36 nm, there is an adverse effect of light reflected at an interface between the silicon semiconductor layer 4 and the embedded oxide layer 3, so that the photodiode 1 tends to react with visible light having a wavelength longer than 400 nm. When the thickness of the silicon semiconductor layer 4 becomes less than 3 nm, it is difficult to absorb a variance in a thickness when the silicon semiconductor layer 4 is formed in the semiconductor wafer.

For the reasons described above, the portions of the silicon semiconductor layer 4 in the first thin film forming area 7a and the second thin film forming area 7b have different thicknesses in the range described above. More specifically, in the embodiment, the portion of the silicon semiconductor layer 4 in the first thin film forming area 7a has a thickness of 35 nm, and the portion of the silicon semiconductor layer 4 in the second thin film forming area 7b has a thickness of 10 nm. Further, the other portion of the silicon semiconductor layer 4 has a thickness in a range between 40 nm and 100 nm (such as 50 nm in the embodiment), so that it is possible to secure an operation of MOSFETs such as the nMOS element 31.

A method of producing the photo IC having the photodiode described above will be explained with reference to FIGS. 3(A)-3(E) to 6(A)-6(E).

In the embodiment, the semiconductor wafer has the SOI structure, in which the silicon layer is formed with an SIMOX (Separation by Implanted Oxygen) method to remain on the embedded oxide layer 3. Alternatively, the silicon layer is attached to the embedded oxide layer 3 to form the semiconductor wafer having the SOI structure. Then, a sacrifice oxidation film is formed in the silicon layer with a thermal oxidation method, and the sacrifice oxidation film is removed through wet etching to form the silicon semiconductor layer 4 having a thickness of 50 nm.

Figure 3A:
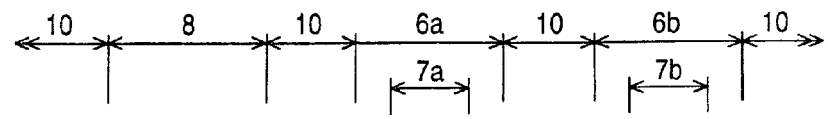
FIGS. 3(A) to 3(E) are schematic sectional views No. 1 showing a method of producing a photo IC (Integrated Circuit) having the photodiode according to the embodiment of the present invention.

As shown in FIG. 3(A), first, the embedded oxide layer 3 is formed on the supporting substrate 2, and the silicon semiconductor layer 4 having a thickness of 50 nm is formed on the embedded oxide layer 3, thereby preparing the semiconductor wafer. Then, a pad oxidation film with a small thickness is formed on the silicon semiconductor layer 4 with a thermal oxidation method, and a silicon nitride film formed of silicon nitride is formed on the pad oxidation film with a CVD (Chemical Vapor Deposition) method.

In the next step, a resist mask (not shown) is formed on the silicon nitride film through photolithography, so that the element separation area 10 is exposed. Then, the silicon nitride film is removed through anisotropic etching with the resist mask as a mask, so that the pad oxidation film is exposed.

In the next step, the resist mask is removed, and the silicon semiconductor layer 4 in the element separation area 10 is oxidized with the silicon nitride film thus exposed as a mask through an LOCOS (Local Oxidation of Silicon) method, so that the element separation layer 9 reaching the embedded oxide layer 3 is formed. Then, the silicon nitride film and the pad oxidation film are removed, so that the element separation layer 9 is formed in the silicon semiconductor layer 4 in the element separation area 10.

In the next step, a resist mask (not shown) is formed to cover the transistor forming area for forming the pMOS element (not shown) through photolithography, so that the silicon semiconductor layer 4 is exposed in the first diode forming area 6a, the second diode forming area 6b, and the transistor forming area 8. Then, the P-type impurity is implanted into the silicon semiconductor layer 4 thus exposed in the first diode forming area 6a, the second diode forming area 6b, and the transistor forming area 8 with the resist mask as a mask, thereby forming P-type low concentration implanted layers 43 in the silicon semiconductor layer 4. Afterward, the resist mask is removed.

Figure 3B:
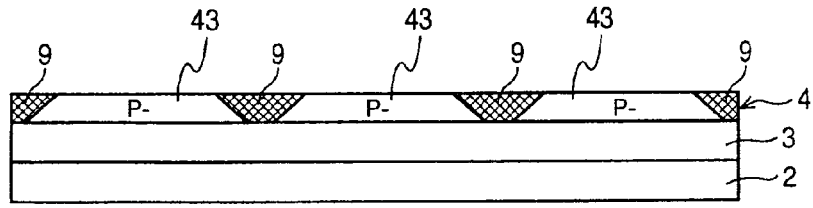

As shown in FIG. 3(B), in the next step, the upper surface of the silicon semiconductor layer 4 is oxidized with a thermal oxidation method, thereby forming a silicon oxide film 44 formed of silicon oxide. Further, poly-silicon is deposited on the silicon oxide film 44 with the CVD method, thereby forming a poly-silicon film 45 with a relatively large thickness.

Figure 3C:
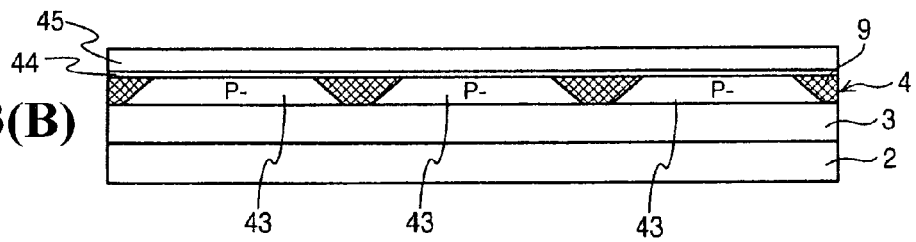

As shown in FIG. 3(C), in the next step, a resist mask (not shown) is formed on the ply-silicon film 45 through photolithography for covering an area for forming the gate electrode 33 in the transistor forming area 8 at a center portion thereof in the gate length direction. Then, the poly-silicon film 45 and the silicon oxide film 44 are etched through anisotropy etching with the resist mask as a mask for exposing the silicon semiconductor layer 4, so that the gate electrode 33 is formed to face the silicon semiconductor layer 4 with the gate oxide film 32 in between. Afterward, the resist mask is removed.

Figure 3D:
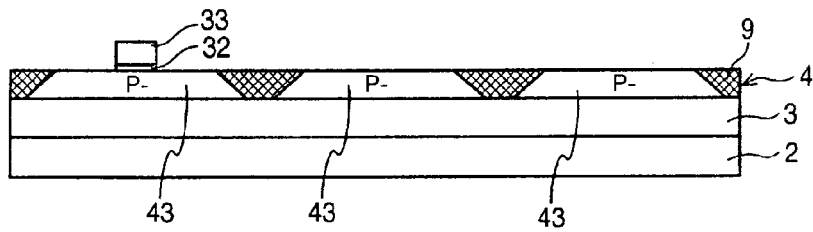

As shown in FIG. 3(D), in the next step, the resist mask 41 is formed through photolithography for exposing the first diode forming area 6a, the second diode forming area 6b, areas for forming the first N+ diffusion layer 14 and the second N+ diffusion layer 24 (areas having the E character shape shown in FIG. 1), and the transistor forming area 8. Then, the N-type impurity is implanted into the silicon semiconductor layer 4 and the gate electrode 33 thus exposed with the resist mask 41 as a mask, so that the N-type impurity is implanted into the gate electrode 33 at the intermediate concentration. Further, N-type intermediate concentration implanted layers 46, in which the N-type impurity is implanted at the intermediate concentration, are formed in the silicon semiconductor layer 4 in areas for forming the extension portions 37 at both sides of the gate electrode 33 and the areas for forming the first N+ diffusion layer 14 and the second N+ diffusion layer 24.

Figure 3E:
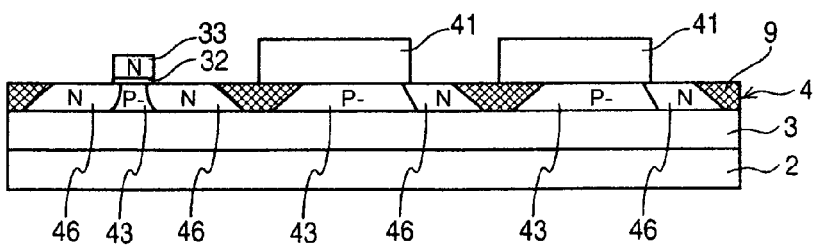

As shown in FIG. 3(E), in the next step, the resist mask 41 formed in the step shown in FIG. 3(D) is removed. Then, the resist mask 41 is formed through photolithography for exposing the first diode forming area 6a, the second diode forming area 6b, and areas for forming the first P+ diffusion layer 12 and the second P+ diffusion layer 22 (areas having the n character shape shown in FIG. 1). Then, the P-type impurity is implanted with the resist mask 41 as a mask, so that P-type intermediate concentration implanted layers 47, in which the P-type impurity is implanted at the intermediate concentration, are formed in the silicon semiconductor layer 4 in the areas for forming the first P+ diffusion layer 12 and the second P+ diffusion layer 22.

As shown in FIG. 4(A), in the next step, the resist mask 41 formed in the step shown in FIG. 3(E) is removed. Then, silicon nitride is deposited on an entire surface of the silicon semiconductor layer 4 including the gate electrode 33 with the CVD method to form a silicon nitride film. Then, the silicon nitride film is etched through anisotropic etching. Accordingly, the upper surface of the gate electrode 33 and the upper surface of the silicon semiconductor layer 4 are exposed, and the sidewalls 34 are formed on both sides of the gate electrode 33.

As shown in FIG. 4(B), in the next step, the resist mask 41 similar to that in the step shown in FIG. 3(D) is formed through photolithography. Then, the N-type impurity is implanted into the silicon semiconductor layer 4 and the poly-silicon of the gate electrode 33 with the resist mask 41 as a mask, so that the N-type impurity is implanted into the gate electrode 33 at the high concentration. Further, N-type high concentration implanted layers 48, in which the N-type impurity is implanted at the high concentration, are formed in the silicon semiconductor layer 4 in areas for forming the source layer 35 and the drain layer 36 at both sides of the gate electrode 33 and the areas for forming the first N+ diffusion layer 14 and the second N+ diffusion layer 24.

As shown in FIG. 4(C), in the next step, the resist mask 41 formed in the step shown in FIG. 4(B) is removed. Then, the resist mask 41 similar to that in the step shown in FIG. 3(E) is formed through photolithography. Then, the P-type impurity is implanted into the silicon semiconductor layer 4 thus exposed with the resist mask 41 as a mask, so that P-type high concentration implanted layers 49, in which the P-type impurity is implanted at the high concentration, are formed in the silicon semiconductor layer 4 in the areas for forming the first P+ diffusion layer 12 and the second P+ diffusion layer 22.

As shown in FIG. 4(D), in the next step, the resist mask 41 formed in the step shown in FIG. 4(C) is removed. Then, the impurities implanted into each of the implanted layers formed in each of the areas for forming each of the diffusion layers are activated, so that the impurities of the specific types are diffused in each of the diffusion layers at the specific concentrations. As a result, the first P+ diffusion layer 12, the first N+ diffusion layer 14, and the first P− diffusion layer 15 of the first photosensitive element 11 are formed in the first diode forming area 6a, and the second P+ diffusion layer 22, the second N+ diffusion layer 24, and the second P− diffusion layer 25 of the second photosensitive element 21 are formed in the second diode forming area 6b. At the same time, the source layer 35, the drain layer 36, the extension portions 37, and the channel area 38 of the nMOS element 31 are formed in the transistor forming area 8.

Figure 4E:
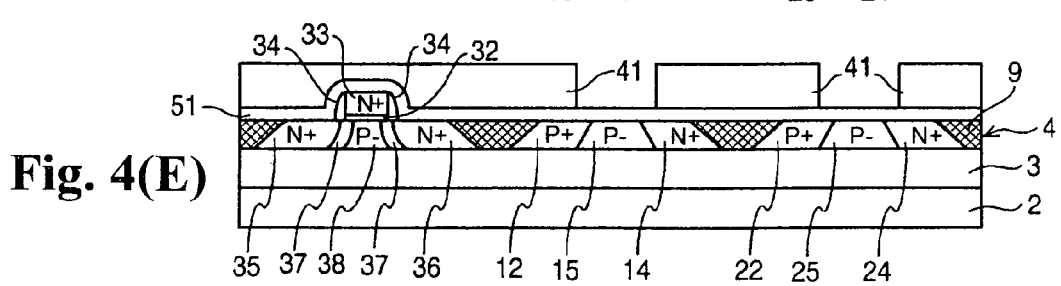

As shown in FIG. 4(E), in the next step, after a thermal processing, an insulation material with transparency such as silicon oxide, NSG (Non-doped Silica Glass), and the likes is deposited on the entire surface of the silicon semiconductor layer 4 including the gate electrode 33, thereby forming an NSG layer 51 as an insulation layer. Then, the resist mask 41 is formed on the NSG layer 51 through photolithography for exposing the NSG layer 51 in the first thin film forming area 7a and the second thin film forming area 7b.

Figure 5A:
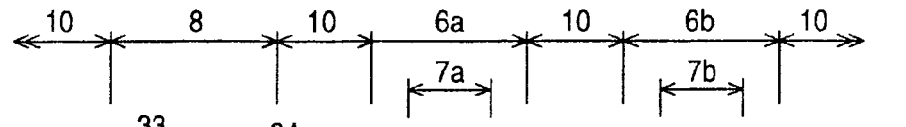
FIGS. 5(A) to 5(E) are schematic sectional views No. 3 showing the method of producing the photo IC having the photodiode according to the embodiment of the present invention.
Figures 6A, 6B:
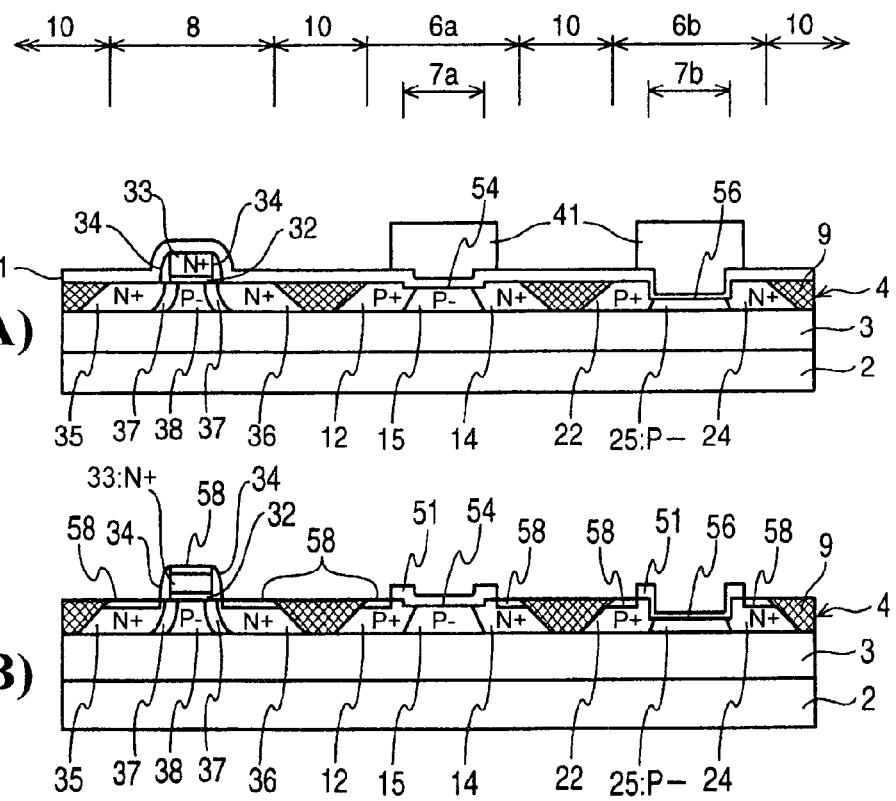
FIGS. 6(A) and 6(B) are schematic sectional views No. 4 showing the method of producing the photo IC having the photodiode according to the embodiment of the present invention.

As shown in FIG. 5(A), in the next step, the NSG layer 51 thus exposed is etched through anisotropy etching, which selectively etches NSG, with the resist mask 41 formed in the step shown in FIG. 4(E) as a mask, so that opening portions 52 are formed to expose the silicon semiconductor layer 4 in the first thin film forming area 7a and the second thin film forming area 7b. Then, the resist mask 41 formed in the step shown in FIG. 4(E) is removed.

Figure 5B:
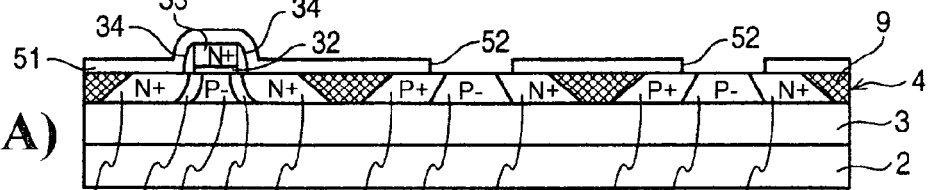

As shown in FIG. 5(B), in the next step, the silicon semiconductor layer 4 thus exposed is etched through dry etching, which selectively etches silicon, with the NSG layer 51 with the opening portions 52 formed in the step shown in FIG. 5(A) as a mask. Accordingly, recess portions 54 are formed in the silicon semiconductor layer 4 in the first thin film forming area 7a and the second thin film forming area 7b, so that the thickness of the silicon semiconductor layer 4 in the first thin film forming area 7a is set at a specific level (35 nm in the embodiment), i.e., the thickness of the first P− diffusion layer 15 is set at a specific level.

Figure 5C:
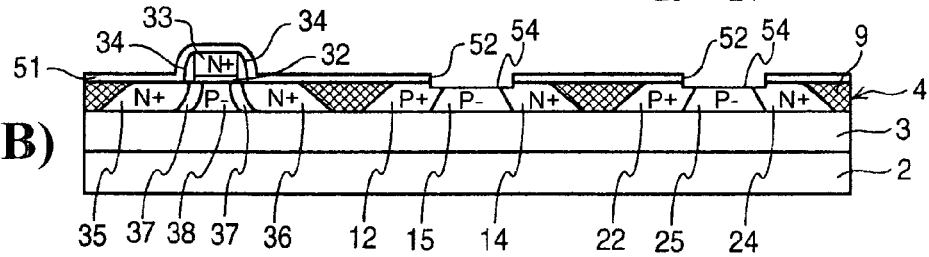

As shown in FIG. 5(C), in the next step, after the recess portions 54 are formed, while the NSG layer 51 remains as is, the NSG is deposited on the entire surface of the silicon semiconductor layer 4 including the NSG layer 51 and the recess portions 54 with the CVD method, thereby increasing a thickness of the NSG layer 51. After the thickness of the NSG layer 51 increases, the resist mask 41 is formed on the NSG layer 51 through photolithography for exposing the NSG layer 51 in the second thin film forming area 7b.

Figure 5D:
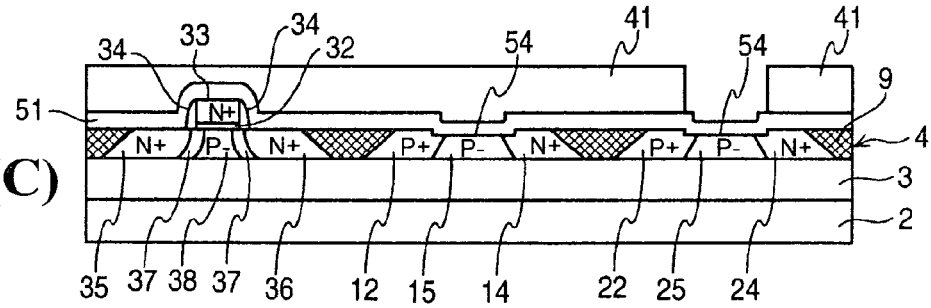

As shown in FIG. 5(D), in the next step, similar to the step shown in FIG. 5(A), the NSG layer 51 thus exposed is etched with the resist mask 41 formed in the step shown in FIG. 5(C) as a mask, so that an opening portion 55 is formed for exposing the recess portion 54 of the silicon semiconductor layer 4 in the second thin film forming area 7b. Then, the resist mask 41 formed in the step shown in FIG. 5(C) is removed.

Figure 5E:
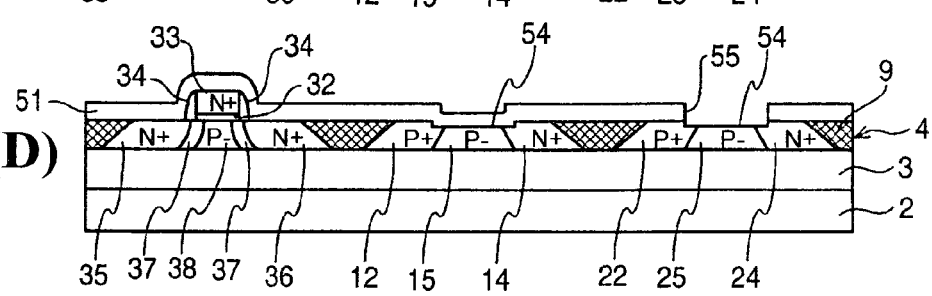

As shown in FIG. 5(E), in the next step, similar to the step shown in FIG. 5(C), the silicon semiconductor layer 4 thus exposed is etched with the NSG layer 51 with the opening portion 55 formed in the step shown in FIG. 5(DA) as a mask. Accordingly, a recess portion 56 is formed in the silicon semiconductor layer 4 in the second thin film forming area 7b, so that the thickness of the silicon semiconductor layer 4 in the second thin film forming area 7b is set at a specific level (10 nm in the embodiment), i.e., the thickness of the second P− diffusion layer 25 is set at a specific level.

As shown in FIG. 6(A), in the next step, after the recess portion 56 is formed, while the NSG layer 51 remains as is, the NSG is deposited on the entire surface of the silicon semiconductor layer 4 including the gate electrode 33, the NSG layer 51, and the recess portion 56 with the CVD method, thereby increasing the thickness of the NSG layer 51. After the thickness of the NSG layer 51 increases, the resist mask 41 is formed on the NSG layer 51 through photolithography for covering the NSG layer 51 in the first thin film forming area 7a, the second thin film forming area 7b, and surrounding areas thereof. Accordingly, the resist mask 41 exposes the silicon semiconductor layer 4 and poly-silicon of the first P+ diffusion layer 12, the second N+ diffusion layer 24, the first N+ diffusion layer 14, the second N+ diffusion layer 24, the source layer 35 and the drain layer 36 of the nMOS element 31, and an area for forming a silicide layer on the gate electrode 33.

As shown in FIG. 6(B), in the next step, the NSG layer 51 thus exposed is etched through anisotropy etching with the resist mask 41 formed in the step shown in FIG. 6(A) as a mask, so that the silicon semiconductor layer 4 and poly-silicon of the gate electrode 33 are exposed.

After the resist mask 41 is removed, a silicidation material layer formed of a silicidation material such as cobalt (Co), titanium (Ti), and nickel (Ni) (cobalt in the embodiment) is formed over the entire surface of the silicon semiconductor layer 4 including the element separation layer 9.

In the next step, the silicon semiconductor layer 4 of the first P+ diffusion layer 12, the second N+ diffusion layer 24, the first N+ diffusion layer 14, the second N+ diffusion layer 24, and the source layer 35 and the drain layer 36 of the nMOS element 31, and poly-silicon of the gate electrode 33 are silicidated through a silicidation process including RTA (Rapid Thermal Anneal), thereby forming silicide layers 58 in the diffusion layers. In the silicidation process, RTA is applied, and the silicidation material layer remaining un-reacted is removed.

In the next step, while the NSG layer 51 remains as is, the NSG is deposited on the entire surface of the silicon semiconductor layer 4 with the CVD method to have a relatively large thickness. Then, an upper surface of the NSG thus deposited is flattened to form an interlayer insulation film.

In the next step, a resist mask (not shown) is formed on the interlayer insulation film through photolithography, so that opening portions are formed in the resist mask for exposing the interlayer insulation film in the first P+ diffusion layer 12, the second P+ diffusion layer 22, the first N+ diffusion layer 14, the second N+ diffusion layer 24, and an area for forming a contact hole on the drain layer 36. Then, anisotropy etching, which selectively etches the NSG, is performed with the resist mask as a mask, so that contact holes reaching the silicide layers 58 of the diffusion layers are formed to penetrate through the interlayer insulation film.

After the resist mask is removed, a conductive material fills the contact holes with the CVD method or a sputter method to form contact plugs. Then, upper surfaces of the contact plugs are flattened, so that an upper surface of the interlayer insulation film is exposed. Similarly, a conductive material fills the contact hole reaching the gate electrode 33 to form a contact plug. Then, a flattening process is performed, thereby completing the photo IC.

As described above, in the first photosensitive element 11 and the second P+ diffusion layer 22, after the specific impurities are implanted into each of the diffusion layers, the silicon semiconductor layer 4 in the first thin film forming area 7a and the second thin film forming area 7b is processed though etching with the NSG layer 51 having the opening portions 52 and 54, thereby forming the first P− diffusion layer 15 and the second P− diffusion layer 25 having the specific thicknesses.

Accordingly, when the impurity ions are implanted at the high concentration to form the first P+ diffusion layer 12, the second P+ diffusion layer 22, the first N+ diffusion layer 14, and the second N+ diffusion layer 24, it is possible to prevent rough upper surfaces of the areas, i.e., the first P− diffusion layer 15 with a small thickness and the second P− diffusion layer 25 with a further small thickness, adjacent to each of the high concentration diffusion layers.

Further, it is possible to reduce a dark current of the first photosensitive element 11 or the second P+ diffusion layer 22 having the first P− diffusion layer 15 and the second P− diffusion layer 25 with thicknesses smaller than each of the high concentration diffusion layers. As a result, it is possible to accurately detect an intensity of ultraviolet light. Further, it is possible to separate ultraviolet light in three wavelength regions and detect intensities thereof through a calculation of two outputs of the first photosensitive element 11 and the second photosensitive element 21 (refer to Japanese Patent Application No. 2007-44465).

In the embodiment, when the impurity ions are implanted into each of the high concentration diffusion layers at the high concentration, even if a rough surface is generated in the upper surface of the P− diffusion layer in the area adjacent to each of the high concentration diffusion layers, it is possible to flatten the area having the rough surface in the later step. Accordingly, it is possible to stably form the first photosensitive element 11 and the second photosensitive element 21 having a reduced dark current.

An experiment of measuring the dark current was conducted using the first photosensitive element 11 formed with the method described above. In the experiment, the first photosensitive element 11 included the first P+ diffusion layer 12 and the first N+ diffusion layer 14 with a thickness of 50 nm and the first P− diffusion layer 15 with a thickness of 35 nm.

Figure 7:
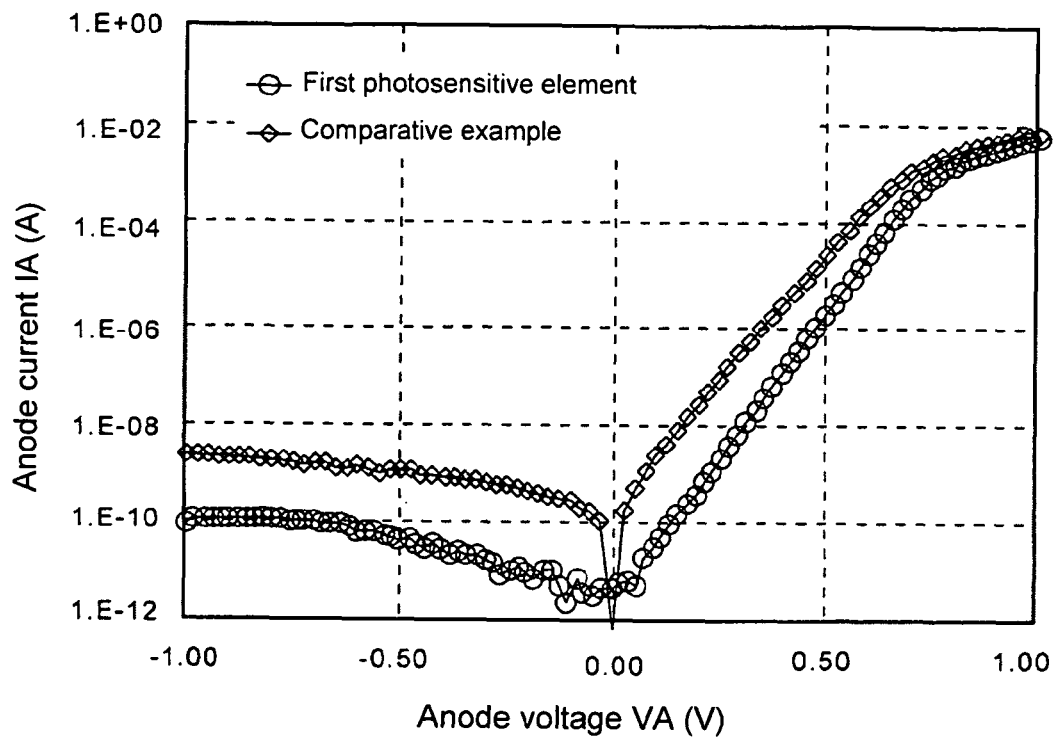
FIG. 7 is a graph showing a relationship between an anode current and an anode voltage of a first photosensitive element according to the embodiment of the present invention.
Figure 8:
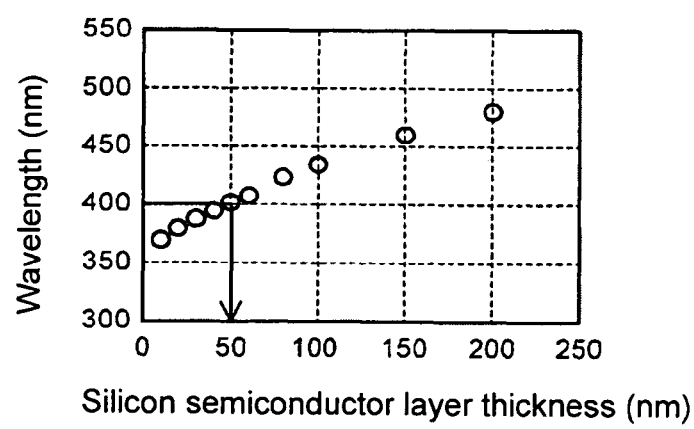
FIG. 8 is a graph showing a relationship between a thickness of a silicon semiconductor layer and a wavelength at which an optical absorptance becomes 10%.
Figure 9:
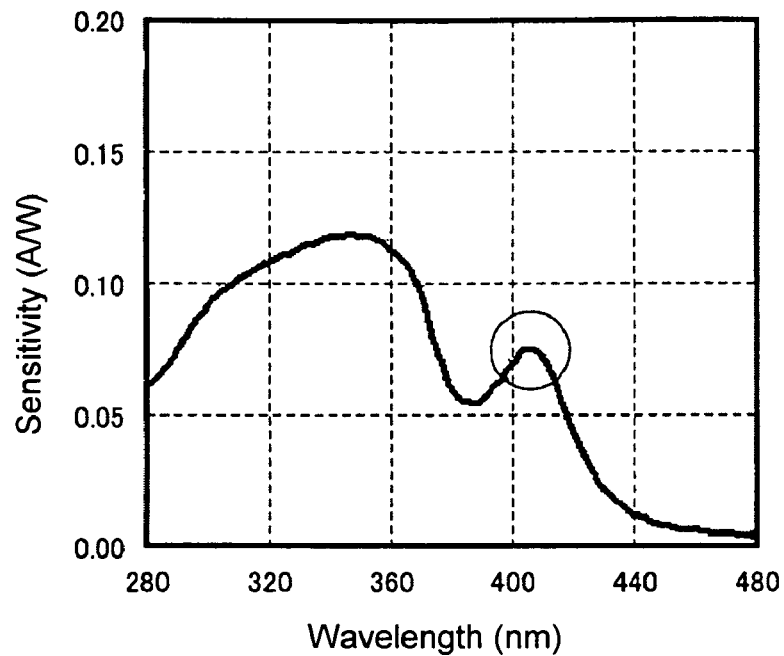
FIG. 9 is a graph showing a sensitivity of a conventional photodiode and a wavelength of light.

FIG. 7 is a graph showing a relationship between an anode current and an anode voltage of the first photosensitive element 11 according to the embodiment of the present invention.

As shown in FIG. 7, the first photosensitive element 11 according to the embodiment of the present invention, in which the first P− diffusion layer 15 has a small thickness, shows an absolute value of the anode current IA (dark current) in a dark room smaller than a comparative example in an entire range of the anode voltage VA.

In the comparative example, a photosensitive element was formed with a method disclosed in Japanese Patent Application No. 2007-44465. In the photosensitive element, a thickness of a silicon semiconductor layer in an area for forming a P− diffusion layer was reduced before each of diffusion layers was formed.

In the first photosensitive element 11 according to the embodiment of the present invention, it is considered that crystal defects in the upper surface of the first P− diffusion layer 15 are reduced, thereby making it possible to suppress generation of a surface de-coupled current. A similar phenomenon may occur in the second photosensitive element 21.

As described above, in the photodiode 1 according to the embodiment, the first P− diffusion layer 15 and the second P− diffusion layer 25 of the first photosensitive element 11 and the second photosensitive element 21 are formed of the silicon semiconductor layer 4 having the thicknesses between 3 nm and 36 nm (35 nm and 10 nm in the embodiment). Accordingly, even when the photodiode 1 receives visible light and visible light reflects at an interface between the silicon semiconductor layer 4 and the embedded oxide layer 3, it is possible to prevent a sub-peak of visible light and block visible light due to the thickness of the silicon semiconductor layer 4. Accordingly, it is possible to accurately detect an intensity of ultraviolet light in the ultraviolet light region less than 400 nm.

In the embodiment, the first P+ diffusion layer 12, the second P+ diffusion layer 22, the first N+ diffusion layer 14, and the second N+ diffusion layer 24 of the photodiode 1 are formed of the silicon semiconductor layer 4 having a thickness equal to that of the silicon semiconductor layer 4 constituting the source layer 35 and the drain layer 36. Accordingly, it is possible to form the contact holes reaching the first P+ diffusion layer 12, the second P+ diffusion layer 22, the first N+ diffusion layer 14, and the second N+ diffusion layer 24 having a depth the same as that of the contact holes reaching the diffusion layers such as the source layer 35 of the nMOS element 31. As a result, as opposed to a case in which the silicon semiconductor layer 4 constituting the nMOS element 31 has a different thickness, it is possible to form the contact plugs with a simple step, thereby making the manufacturing process of the photo IC simple.

Further, in the embodiment, the insulation material layer (the NSG layer 51) is formed of the NSG, i.e., the insulation material the same as that of the interlayer insulation film, as the mask for reducing the thicknesses of the first photosensitive element 11, the second photosensitive element 21, the first P− diffusion layer 15, and the second P− diffusion layer 25. Accordingly, when the interlayer insulation film is formed through increasing the thickness of the insulation material layer while the insulation material layer used as the mask remains, it is possible to ignore an influence of a reflective index when light passes therethrough. As a result, as opposed to a case in which a different insulation material is used, it is possible to eliminate a step of removing the insulation material, thereby making the manufacturing process of the photo IC simple.

As described above, in the embodiment, the photodiode 1 is provided with the first photosensitive element 11 and the second photosensitive element 21. Accordingly, it is possible to separate ultraviolet light in three wavelength regions and detect intensities thereof through a calculation. When a total amount of ultraviolet light is measured, it is possible to form only one of the photosensitive elements, for example, the first photosensitive element 11 having the first P− diffusion layer 15 with a thickness of 35 nm.

In this case, the steps shown in FIG. 5(C) to 5(E) are omitted, and the step shown in FIG. 6(A) is performed after the step shown in FIG. 5(B). Accordingly, while avoiding an influence of reflection at the interface between the silicon semiconductor layer 4 and the embedded oxide layer 3, it is possible to block visible light due to the thickness of the silicon semiconductor layer 4, and to accurately detect the total amount of ultraviolet light in the ultraviolet light region less than 400 nm.

As described above, in the embodiment, the photodiode includes the photosensitive element formed in the silicon semiconductor layer on the embedded oxide film. The photosensitive element includes the P− diffusion layer, the P+ diffusion layer, and the N+ diffusion layer. In the P− diffusion layer, the P-type impurity is diffused at the low concentration. In the P+ diffusion layer, the P-type impurity is diffused at the high concentration. In the N+ diffusion layer, the N-type impurity is diffused at the high concentration. In the photosensitive element, the P+ diffusion layer is arranged to face the N+ diffusion layer with the P− diffusion layer in between.

In the method of producing the photodiode, after the specific impurity is implanted into the area for forming each of the diffusion layers of the silicon semiconductor layer at the specific concentration, the impurity implanted into each of the diffusion layers is activated through the thermal processing, so that the specific impurity is diffused into each of the diffusion layers at the specific concentration.

In the next step, the insulation material layer formed of the insulation material with transparency is formed on the silicon semiconductor layer, and the insulation material layer is etched through etching for selectively removing the insulation material to form the opening portion in the area for forming the P− diffusion layer of the insulation material layer.

In the next step, the silicon semiconductor layer in the area for forming the P− diffusion layer is etched through etching for selectively removing silicon with the insulation material layer having the opening portion as the mask, so that the thickness of the silicon semiconductor layer in the area for forming the P− diffusion layer is reduced to the specific level.

Accordingly, in the embodiment, when the impurity ions are implanted into the P+ diffusion layer and the N+ diffusion layer at the high concentration, it is possible to prevent a rough surface from generating in the upper surface of the P− diffusion layer in the area adjacent to each of the high concentration diffusion layers. Accordingly, it is possible to reduce a dark current of the photosensitive element with the P− diffusion layer having the thickness smaller than that of each of the high concentration diffusion layers. As a result, it is possible to accurately detect an intensity of ultraviolet light.

In the embodiment, the impurity implanted into each of the diffusion layers is activated, so that the specific impurity is diffused into each of the diffusion layers at the specific concentration. Afterward, the thickness of the silicon semiconductor layer in the area for forming the P− diffusion layer is reduced to the specific level. Alternatively, after the specific impurity is implanted at the specific concentration, the thickness of the silicon semiconductor layer in the area for forming the P− diffusion layer may be reduced to the specific level. Afterward, the impurity implanted into each of the diffusion layers may be activated, so that the specific impurity is diffused into each of the diffusion layers at the specific concentration. In this way, it is possible to obtain a similar effect.

In the embodiment, the P-type impurity is diffused in the low concentration diffusion layer. Alternatively, the N-type impurity may be diffused in the low concentration diffusion layer at a relatively low concentration to obtain a similar effect.

In the embodiment, the P+ diffusion layer is formed in the n character shape, and the N+ diffusion layer is formed in the E character shape. Alternatively, the P+ diffusion layer and the N+ diffusion layer may be formed in other shape and have a larger number of teeth portions.

In the embodiment, the P+ diffusion layer and the N+ diffusion layer have the teeth portions, and the teeth portions are nested with each other. Alternatively, the P+ diffusion layer and the N+ diffusion layer may have only the base portions arranged to face each other with the low concentration diffusion layer in between.

In the embodiment, the silicon semiconductor layer is formed on the embedded oxide film, i.e., the insulation layer of the semiconductor wafer having the SOI structure. Alternatively, the silicon semiconductor layer may be formed on a sapphire substrate as an insulation layer, i.e., a silicon semiconductor layer of an SOS (Silicon on Sapphire) substrate, or may be formed on a quartz substrate as an insulation layer, i.e., a silicon semiconductor layer of an SOQ (Silicon on Quartz) substrate.

The disclosure of Japanese Patent Application No. 2007-311080, filed on Nov. 30, 2007, is incorporated in the application by reference.

While the invention has been explained with reference to the specific embodiments of the invention, the explanation is illustrative and the invention is limited only by the appended claims.

What is claimed is:

1. A method of producing a photodiode including a photosensitive element formed in a silicon semiconductor layer on an insulation layer, wherein said photosensitive element includes a low concentration diffusion layer with one of a P-type impurity and an N-type impurity diffused therein at a low concentration, a P-type high concentration diffusion layer with the P-type impurity diffused therein at a first high concentration, and an N-type high concentration diffusion layer with the N-type impurity diffused therein at a second high concentration, said P-type high concentration diffusion layer being arranged to face the N-type high concentration diffusion layer with the low concentration diffusion layer in between, comprising the steps of:

forming an insulation material layer formed of an insulation material with transparency on the silicon semiconductor layer after the one of the P-type impurity and the N-type impurity is implanted into the low concentration diffusion layer at the low concentration, the P-type impurity is implanted into the P-type high concentration diffusion layer at the first high concentration, and the N-type impurity is implanted into the N-type high concentration diffusion layer at the second high concentration;

forming an opening portion in the insulation material layer in an area for forming the low concentration diffusion layer through etching for selectively removing the insulation material; and etching the silicon semiconductor layer in the area for forming the low concentration diffusion layer through etching for selectively removing silicon with the insulation material layer having the opening portion as a mask so that a thickness of the silicon semiconductor layer in the area for forming the low concentration diffusion layer is reduced to a specific level.

2. The method of producing the photodiode according to claim 1, before the step of forming the insulation material layer, further comprising the step of activating the P-type impurity and the N-type impurity through a thermal processing so that the one of the P-type impurity and the N-type impurity is diffused in the low concentration diffusion layer at the low concentration, the P-type impurity is diffused in the P-type high concentration diffusion layer at the first high concentration, and the N-type impurity is diffused in the N-type high concentration diffusion layer at the second high concentration.

3. The method of producing the photodiode according to claim 1, after the step of etching the silicon semiconductor layer, further comprising the step of activating the P-type impurity and the N-type impurity through a thermal processing so that the one of the P-type impurity and the N-type impurity is diffused in the low concentration diffusion layer at the low concentration, the P-type impurity is diffused in the P-type high concentration diffusion layer at the first high concentration, and the N-type impurity is diffused in the N-type high concentration diffusion layer at the second high concentration.

4. The method of producing the photodiode according to claim 1, wherein, in the step of etching the silicon semiconductor layer, said thickness of the silicon semiconductor layer in the area for forming the low concentration diffusion layer is reduced to be within a range between 3 nm and 36 nm.

* * * * *